United States Patent [19]
Ouyang et al.

[11] Patent Number: 5,956,269
[45] Date of Patent: Sep. 21, 1999

[54] NON-VOLATILE SRAM

[75] Inventors: Kenneth Wisheng Ouyang; Ding-Hsu Yen, both of Hsinchu, Taiwan

[73] Assignee: Industrial Technology Research Institute, Hsinchu, Taiwan

[21] Appl. No.: 08/964,841

[22] Filed: Nov. 5, 1997

[51] Int. Cl.$^6$ .................................................. G11C 16/00
[52] U.S. Cl. ................ 365/185.08; 365/154; 365/185.07
[58] Field of Search ............................... 365/185.08, 154, 365/185.24, 185.07

[56] References Cited

U.S. PATENT DOCUMENTS

| | | | |
|---|---|---|---|
| 5,189,641 | 2/1993 | Arakawa | 365/185.08 |
| 5,488,579 | 1/1996 | Sharma | 365/185.08 |
| 5,602,776 | 2/1997 | Herdt et al. | 365/185.08 |
| 5,864,499 | 1/1999 | Roohparvar et al. | 365/185.08 |

*Primary Examiner*—Tan T. Nguyen
*Attorney, Agent, or Firm*—Tung & Associates

[57] ABSTRACT

A method and devices are provided for producing a non-volatile SRAM, of the type composed of two back-to-back, cross-coupled, CMOS inverters, each with a PMOS and an NMOS and respective outputs Q and Q~ connected therebetween, even when the cell is completely symmetrical, by creating a stable condition wherein Q≠Q~ through rendering the threshold voltages of the NMOS devices different. The threshold voltages of the NMOSs are made different by using hot electron injection. The hot electron effect is produced by meeting the conditions, that 1) one of the NMOSs must be in saturation condition, i.e., $V_{DS} \geq V_{GS} - V_{th}$, where $V_{DS}$ is the drain to source voltage, $V_{GS}$ is the gate to source voltage, and $V_{th}$ the threshold voltage, of the NMOS, and 2) $V_{DS}$ must be large enough, typically about 7 V, depending on the fabrication process. To achieve these conditions, for example, firstly a regular write function is performed on the SRAM so that the cell will have a predetermined condition, i.e., a high, low or low, high value. A negative voltage pulse is then applied to the inverter with the high output value to put its NMOS in a saturation state. This results in producing hot electrons that are stored in the gate oxide of the NMOS, thus making the threshold voltage of the two NMOS devices unbalanced, i.e., $V_{th1}$ $V_{th2}$, and achieving the function of hard memory.

10 Claims, 6 Drawing Sheets

NON-VOLATILE SRAM

FIELD OF THE INVENTION

The present invention generally relates to SRAM fabrication and, more particularly, to a method and means for producing a non-volatile SRAM.

BACKGROUND OF THE INVENTION

Presently the conventional static random-access memory (SRAM) is in the form of a latch composed of two back-to-back, cross-coupled, CMOS inverters. As seen in FIG. 1, one inverter 10 on one side has a PMOS, Mp1, and an NMOS, Mn1, with the PMOS source connected to voltage source Vdd, the NMOS source connected to ground, and their gates and drains respectively connected together. The other inverter 20 on the other side has a similarly connected PMOS and NMOS, Mp2, Mn2, and both inverters have their commonly connected gates connected to the drains of the PMOS and NMOS on the opposite side. These latter connections to the drains form read/write nodes, that are coupled to respective signal carrying lines, Q~, on the one side, and Q, on the other side Capacitances C1 and C2 are the total node capacitances (including diffusion and routing) and are shown also in the small-signal model equivalent circuit in FIG. 2, wherein Cm is the coupling capacitance between the gates and drains of the MOSFETs. A small-signal analysis of the circuit of FIG. 2 results in the following relationships:

$$g_{m1}v2 + g_{d1}v1 + C_1 dv1/dt + C_m d(v1-v2)/dt = 0$$

and $$g_{m2}v1 + g_{d2}v2 + C_2 dv2/dt + C_m d(v2-v1)/dt = 0$$

where $g_{m1}$, $g_{m2}$ are equivalent transconductances of $M_{p1}/M_{n1}$ and $M_{p2}/M_{n2}$, respectively, and $g_{d1}$, $g_{d2}$ are equivalent conductances.

Applying the LaPlace transforms with appropriate initial conditions the following relationship for the output can be obtained:

$$v_2(t) - v_1(t)$$

$$\left\{ \frac{v_2(0-)}{Q^{1/2}}[ap_1 + C_2(gd1 + gm1) + CmG] - \frac{v_1(0-)}{Q^{1/2}}[ap_1 + C_1(gd2 + gm2) + C_mG] \right\} e^{p1t}$$

$$\left\{ \frac{v_2(0-)}{Q^{1/2}}[ap_2 + C_2(gd1 + gm1) + C_mG] - \frac{v_1(0-)}{Q^{1/2}}[ap_2 + C_1(gd2 + gm2) + C_mG] \right\} e^{p2t}$$

where i=1 and j=2 are for $\mu_2$ (t), while i=2 and j=1 are for $v_1$ (t);

$$p1 = \frac{(-M + Q^{1/2})}{2a}; \quad p2 = \frac{(-M - Q^{1/2})}{2a}$$

$a = C_1 C_2 + C_m(C_1+C_2)$;
$M = gd1 C_2 + gd2 C_1 + C_m G$;
$G = gd1 + gd2 + gm1 + gm2$;
$Q = M^2 - 4a(gd1gd2 - gm1gm2)$

Using the above equation, an important analysis can be carried out. When P1>0 and P2<0, if assuming τ>>0, then $e^{p2t}$ approaches zero. For $e^{p1t}$, the latch is assumed symmetrical and when machine is turned on, $V_1(0\_) = V_2(0\_)$.

The transconductance terms $g_{m1}$ and $g_{m2}$ are related to the NMOS mobility values Un1 and Un2, which in turn relate to the NMOS threshold voltages $V_{th1}$ and $V_{th2}$, such that when:

$g_{m1} > g_{m2}$, then Un1>Un2 and $V_{th1} < V_{th2}$, so Q=low and Q~=high; and conversely, when:

$g_{m1} < g_{m2}$, then Un1<Un2 and $V_{th1} > V_{th2}$, so Q=high and Q~=low.

In a completely symmetrical SRAM cell, if the initial condition of the threshold voltages is $V_{th1} = V_{th2}$, then Q=Q~, and a random result is produced, that is, Q may be high or it may be low, and Q~ may vary similarly as seen in FIG. 1.

Also, in a completely symmetrical SRAM cell, if the initial condition indicates a difference between Q and Q~ and it is larger than a certain voltage, say 0.5 mV, then a correct result can be generated, i.e., under the initial condition, if Q>Q~, then the final (steady state) result is that Q is high and Q~ is low, or if Q<Q~, then the final result is that Q is low and Q~ is high, as seen in FIGS. 3–6. In FIG. 3 the initial conditions are Q=0.2005 V and Q~=0.2 V, with the final result that Q=high and Q~=low. In FIG. 4 the initial conditions are Q=0.2 V and Q~=0.2005 V, with the final result that Q=low and Q~=high. In FIG. 5 the initial conditions are Q=4.8005 V and Q~=4.8 V, with the final result that Q=high and Q~=low. In FIG. 6 the initial conditions are Q=4.8 V and Q~=4.8005 V, with the final result that Q=low and Q~=high.

The random and correct result conditions become an important consideration in a regular or conventional SRAM of the type described because when the system or computer in which it is disposed is turned off or goes down, the originally stored data are extinguished or disappear. This is frequently undesirable, particularly when the system goes down unexpectedly, since when the system is again powered up, the random condition will result with some cells being low, and some being high, so that the stored data is lost unless the initial condition can be made to indicate a difference between Q and Q~.

It is therefore an object of the present invention to provide an SRAM with the quality of being non-volatile, i.e., its condition will not disappear with time or turn off.

It is another object of the invention to provide an SRAM with the quality of being non-volatile, by deliberately causing the threshold voltages transconductance $g_m$, mobility μn of the NMOS devices to be different.

It is further object of the invention to provide a non-volatile SRAM by deliberately causing the threshold voltages transconductance $g_m$, mobility μn of the NMOS devices to be different using the hot electron effect.

SUMMARY OF THE INVENTION

In accordance with the present invention, a method and means is provided for producing a non-volatile SRAM, even when the cell is completely symmetrical, by creating a stable condition wherein Q≠Q~ through rendering the threshold voltages of the NMOS devices different. With this condition, as long as the difference between the Q and Q~ values is large enough, the correct result will be generated, since if the threshold voltages are different, when the cell is turned ON, it will go to a fixed direction avoiding the random condition.

In a preferred embodiment, the threshold voltages of the NMOSs are made different by using hot electron injection.

The hot electron effect can be produced if the following two conditions can be met:

1) one of the NMOSs must be in saturation condition, i.e., $$V_{DS} \geq V_{GS} - V_{Tnmos},$$

where $V_{DS}$ is the drain to source voltage, $V_{GS}$ is the gate to source voltage, and $V_{Tnmos}=V_{th}$ the threshold voltage of the NMOS; and 2) $V_{DS}$ must be large enough, typically over 7 V, depending on the fabrication process.

To achieve these conditions, for example, firstly a regular write function is performed on the latch so that the cell will have a predetermined high, low (1,0) value or a low, high (0,1) value. In the instance where Q~ is high, e.g., 5 V, and Q is low, e.g., 0 V (FIG. 7), the gate voltages of Mp1 and Mn1, by virtue of their connection to the drains at node 2, will be 0 V. In this circumstance, Mp1 will be turned ON and Mn1 will be OFF as the voltage at the drain connection or node 1 will be Vdd, i.e., 5 V. Since node 1 is connected to the gates of Mp2 and Mn2, their gate voltages will become 5 V. Q being low, Mp2 will be OFF and Mn2 will be turned ON. The source of Mn1 is grounded (net 27, GND 1) and the source of Mn2 is grounded (net 31, GND 2), which grounds GND 1 and GND 2 are normally at 0 V. With this existing condition, the cell can be made non-volatile by selectively applying a negative voltage pulse, e.g., −3 volts, to GND 1 by adding an increased voltage between Vdd and GND1. Under these circumstances, the values for Mn1 will be $V_D$=5 V, $V_G$=0 V, $V_{Tnmos}$=typically 1 V, and, as a result of the pulse, $V_S$=(−3 V). Accordingly, $V_{GS}-V_{Tnmos}$=[0−(−3)]−1=2 V, and $V_{DS}$=5−(−3)=8 V. As the two conditions are fulfilled by this situation, the hot electron effect is produced and the hot electrons are stored in the gate oxide of Mn1. Therefore, it becomes non-volatile, i.e., the charge or the threshold voltage difference of the two NMOS devices does not disappear with time so that the cell will produce a correct result when it is turned ON. Consequently, a non-volatile SRAM may be achieved with the invention that may be used instead of a conventional EPROM or Flash in many memory applications.

The advantages of the invention are several folds. First, the non-volatile SRAM can be fabricated by a CMOS process. Secondly, the non-volatile SRAM can be incorporated in the ASIC/logic chips easily. Thirdly, this invention still retain the advantages of SRAM such as a quick read/write operation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

We use the hot electron approach to make $V_{tn1} \neq V_{tn2}$ (i.e., $g_{mn1} \neq g_{mn2}$, or $M_{n1} \neq M_{n2}$). To a symmetrical SRAM cell, we generate hot electrons in a NMOS device, and inject into gate oxide to produce NMOS device threshold voltage difference. We also use a SRAM cell,(i.e., a cross couple latch structure) which has a characteristic of a positive-feedback which is a non-volatile SRAM. Hot electron→$V_{tn1}>V_{tn2}$(i.e., $g_{mn1}<g_{mn2}$, $M_{n1}<M_{n2}$) or $V_{tn1}<V_{tn2}$→non -volatile (i.e., $g_{mn1}>g_{mn2}$, $M_{n1}>M_{n2}$) where $g_{mn1}$ is the transconductance of $NMOS_1$, $M_{n1}$ is the mobility of $NMOS_1$, and $V_{tn1}$ is the threshold voltage of $NMOS_1$.

The present invention is directed to a method and means that provide a non-volatile SRAM, of the type composed of two back-to-back, cross-coupled, CMOS inverters, each with a PMOS and an NMOS and respective outputs Q and Q~ connected therebetween, by deliberately causing the threshold voltages of the NMOS devices to be different or unbalanced so that when the cell is turned ON, it will go to a fixed direction avoiding the random condition, and remaining in a condition that will last over time. Compare to a conventional non-volatile memory, although both methods involve injecting hot electrons into a dielectric, the present invention provides the advantage of a positive feedback characteristic of a cross couple latch, i.e., only a small threshold voltage difference can results in a desirable state. This can be achieved by no special or expensive processes.

In a preferred embodiment, the threshold voltages of the NMOSs are made different by using hot electron injection. The hot electron effect can be produced if the following two conditions are met:

1) one of the NMOSs must be in saturation condition, i.e., $$V_{DS} \geq V_{GS} - V_{Tnmos},$$

where $V_{DS}$ is the drain to source voltage, $V_{GS}$ is the gate to source voltage, and $V_{Tnmos}=V_{th}$ the threshold voltage, of the NMOS; and 2) $V_{DS}$ must be large enough, typically larger than 7 V, depending on the fabrication process.

Figure 1:
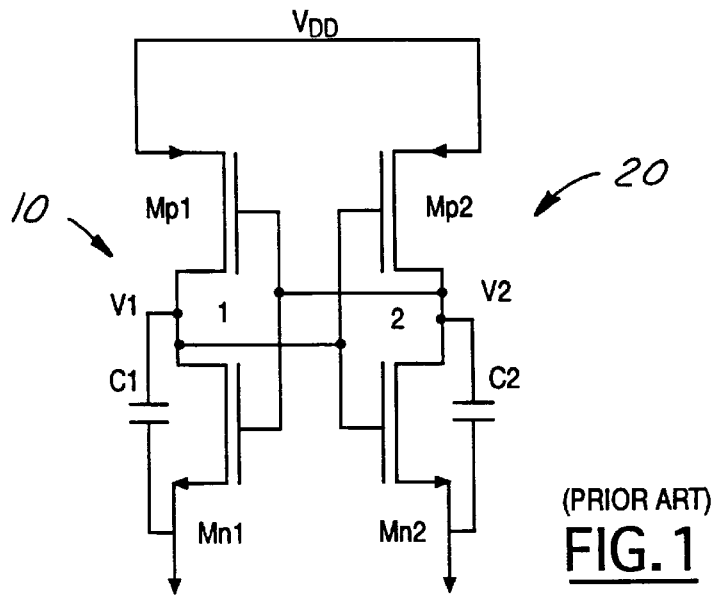
FIG. 1 is a schematic diagram illustrating an SRAM, of the type composed of two back-to-back, cross-coupled, CMOS inverters, each with a PMOS and an NMOS and respective outputs Q and Q~ connected therebetween, in accordance with the prior art.
Figure 2:
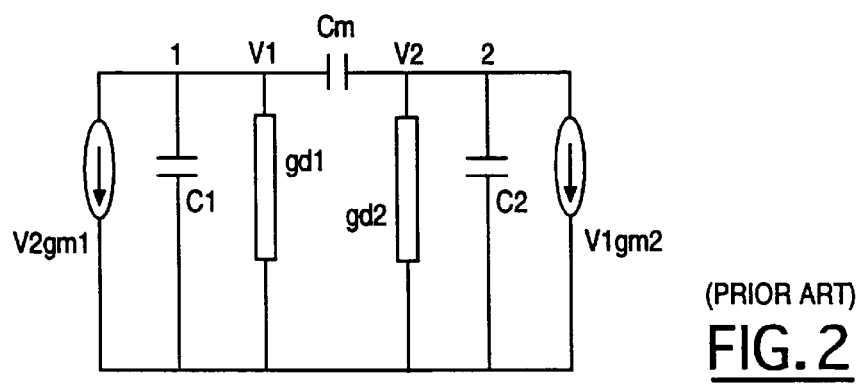
FIG. 2 illustrates a small-signal model for the SRAM of FIG. 1.
Figure 3:
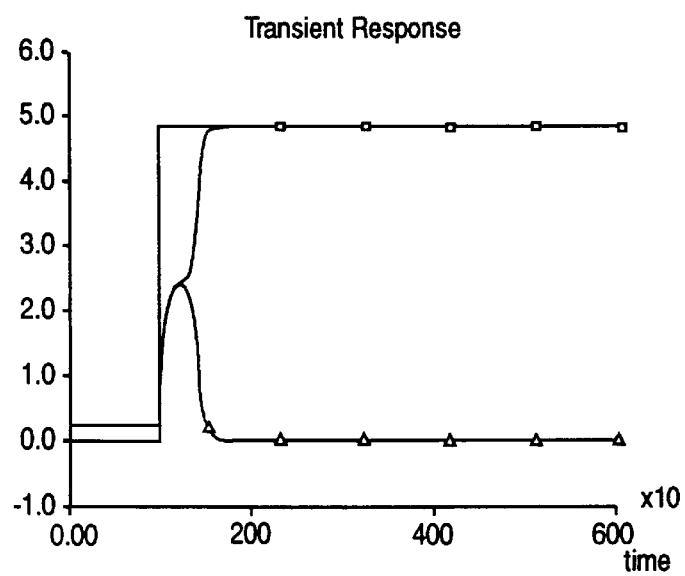
FIGS. 3–6 are plots illustrating the transient responses of a completely symmetrical SRAM cell, with different initial conditions that produce differences between Q and Q~.
Figure 4:
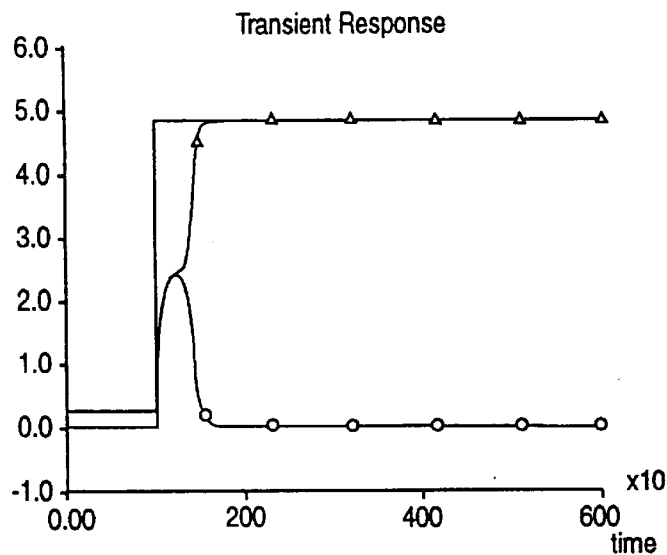
Figure 5:
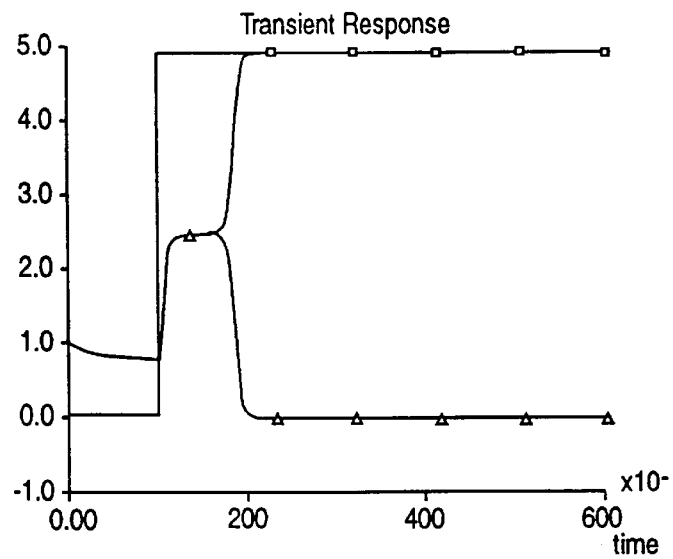
Figure 6:
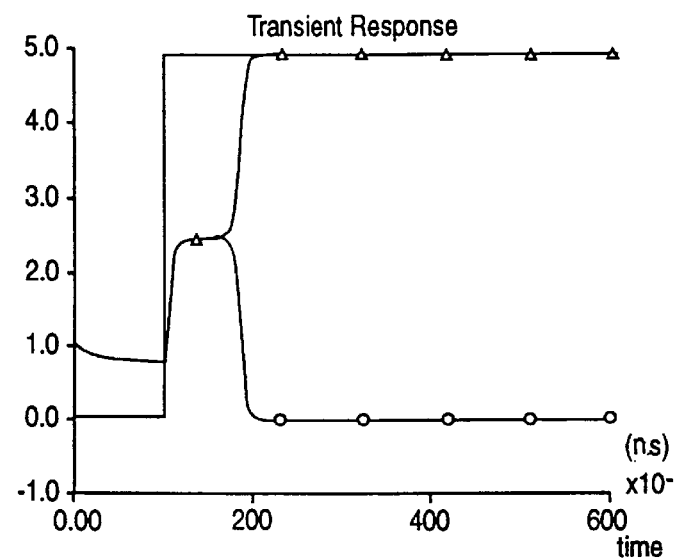
Figure 7:
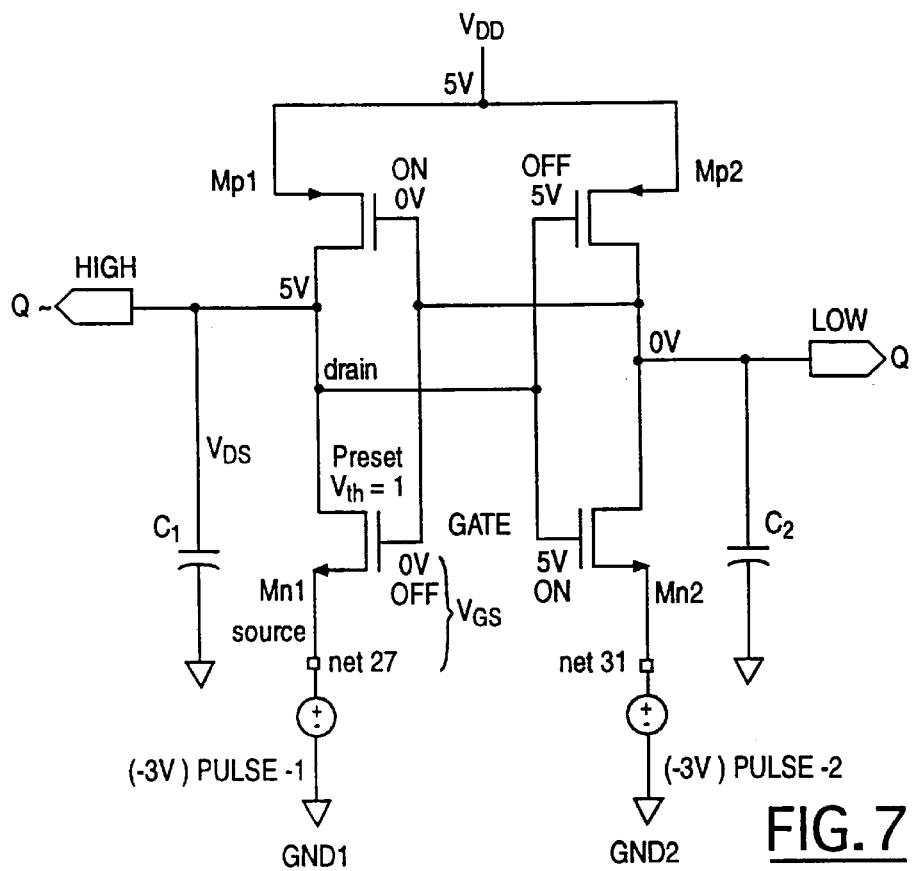
FIG. 7 is a schematic diagram of an SRAM, of the type shown in FIG. 1, illustrating conditions of the components to achieve results in accordance with the present invention.
Figure 8:
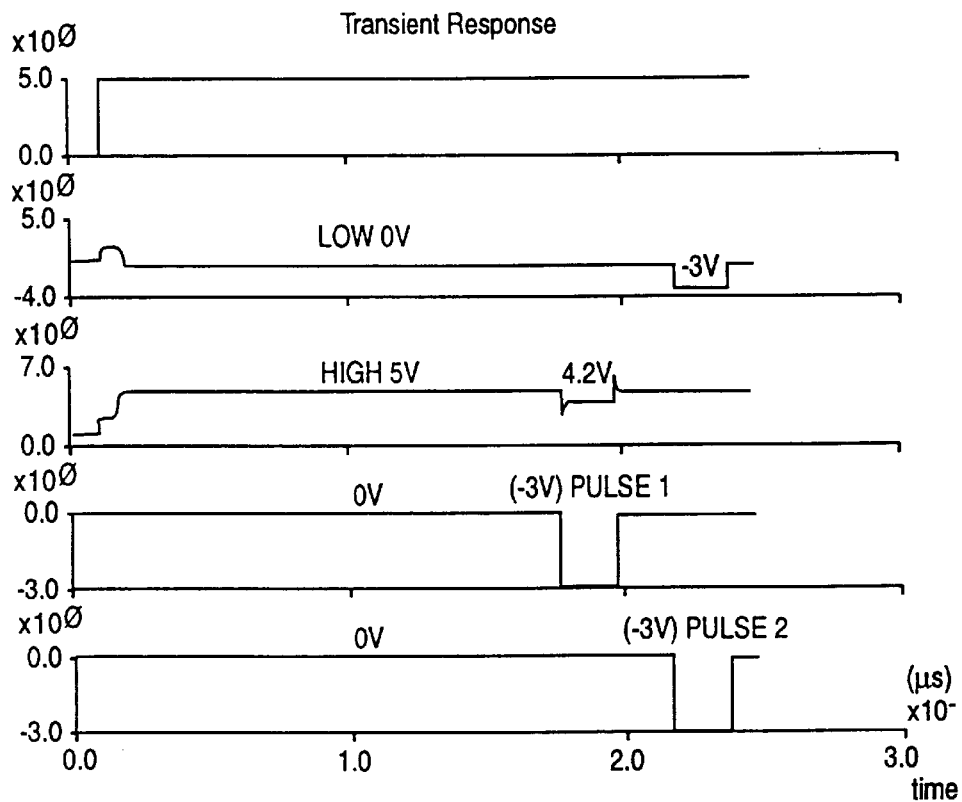
FIG. 8 illustrates the transient responses of the portions of the SRAM of FIG. 7 during the performance of the method in accordance with the invention.

To implement the producing of non-volatility in the cell, for example, firstly a regular write function is performed on the latch so that the cell will have a 1,0 value or a 0,1 value. As will be seen in the FIGS. 7 and 8, when inverter 10 has a 1 value and inverter 20 a 0 value, Q~ is high, e.g., 5 V, and Q is low, e.g., 0 V. The gate voltages of Mp1 and Mn1, by virtue of their connection to the drains of the inverter 20 and node 2, will be 0 V. In this circumstance, Mp1 will be turned ON and Mn1 will be OFF as the voltage at the drain connection or node 1 of inverter 10 will be Vdd, i.e., 5 V. Since node 1 is connected to the gates of Mp2 and Mn2, their gate voltages will become 5 V. Q being low, Mp2 will be OFF and Mn2 will be turned ON. Inverter 10 is grounded (net 27, GND 1) through the source of Mn1 and inverter 20 is grounded (net 31, GND 2) through the source of Mn2, which grounds GND 1 and GND 2 are normally at 0 V. With this existing condition, the cell can be made non-volatile by selectively applying a negative voltage pulse (-X volts) to the appropriate GND. In the exemplary situation, this can be accomplished as follows:

In inverter 10, $V_D$=5 V, $V_G$=0 V, $V_{Tnmos}$=1 V, and if a pulse, Pulse-1, is impressed at the source, net 27, $V_S$=(-3 V). Accordingly, $V_{GS}-V_{Tnmos}$=[0-(-3)]-1=2 V; and $$V_{DS}=5-(-3)=8\ V.$$

As the conditions are fulfilled by this situation, the hot electron effect is produced and the hot electrons are stored in the gate oxide of Mn1. Therefore, it becomes non-volatile, i.e., the charge or the threshold voltage difference of the two NMOS devices does not disappear with time.

In inverter 20, $V_D$=-3 V, $V_G$=5 V, $V_{Tnmos}$=1 V, and if a pulse, Pulse-2, is impressed at the source, net 31, $V_S$=(-3 V), then:

$$V_{GS}-V_{Tnmos}=[5-(-3)]-1=7\ V;$$

and $$V_{DS}=-3-(-3)=0\ V.$$

As the conditions are not fulfilled by this situation, no hot electron effect is produced and Mn2 will not receive hot electrons. Thus, it will be seen that GND 1 and GND 2 may be a common ground to which the negative voltage pulse is applied since only Mn1 will store the hot electrons and the desired unbalance will be produced. The unbalanced condition once stored will continue so that when the cell is turned OFF and then turned ON again, the original stored data will be resurrected.

Typically the occurrence of the hot electron effect in the regular fabrication process is avoided in the art. However, here it is used to advantage, by changing the normal fabrication condition wherein the applied voltage is 5 V, through the application of a pull down voltage, e.g., about -3 V, -4 V, or -5 V, in order to produce a difference of about 8–10 V, fulfilling the first condition of producing hot electrons, i.e., the drain to source voltage $V_{DS}$ is large enough. When the process is begun, after writing in, the voltage across the cell is Vdd, typically 5 V. The threshold voltages are the same, typically preset and written in at 1 V. When the negative voltage pulse is then impressed across each of the inverters, as explained above the only one that produces the hot electrons is the one that has the output at high. The result of the hot electron production is the storing of hot electrons in the gate oxide of the appropriate MOS increasing its threshold voltage. The inverters thus become unsymmetrical, $V_{th1} \ne V_{th2}$, so that after power down and subsequent turn ON, the output of the increased threshold voltage inverter will still turn out as high, rendering the memory cell non-volatile.

Figure 9:
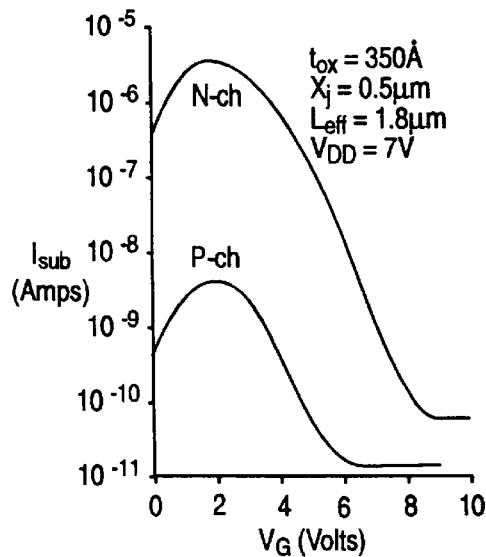
FIG. 9 is a plot illustrating the substrate currents with respect to gate voltage $V_G$ in a PMOS and an NMOS such as used in the inverters in the SRAM in FIG. 7.
Figure 10:
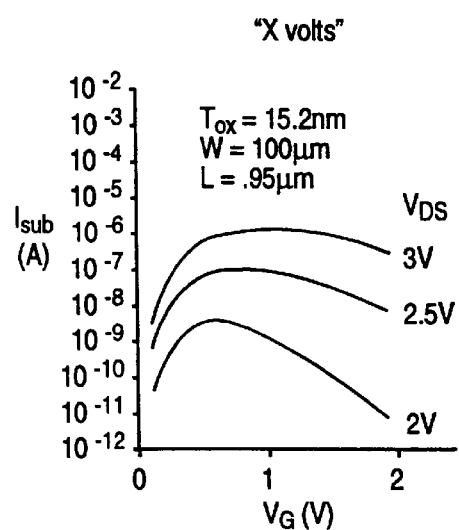
FIG. 10 is a plot illustrating the substrate currents with respect to the gate to source voltage $V_{GS}$ in an NMOS such as used in the inverters in the SRAM in FIG. 7 in terms of various drain to source voltages $V_{DS}$, i.e., 2 V, 2.5 V, and 3 V.

It should be understood that in a typical MOS the substrate current is related to the hot electron effect. The normal MOS has no substrate current, only channel current. Substrate current is produced only by hot electron injection, so that measurement of the substrate current will indicate the magnitude of the hot electron injection. As will be seen from the plots of substrate currents, with respect to gate voltage $V_G$ and gate to source voltage $V_{GS}$ respectively in FIGS. 9 and 10, the NMOS hot electron effect is much larger than the PMOS hot electron effect by about 1000 times. Thus, it is more difficult to produce hot carriers with a PMOS than with an NMOS which will take a much shorter time to produce the hot electrons. Accordingly, the NMOSs of the two inverters in the SRAM are chosen as the objects of the hot electron effect. In FIG. 10 the relationship of $V_{DS}$ to $V_{GS}$ is shown, and from which the optimum point may be chosen for the $V_{DS}$, from the three values plotted, i.e., 2 V, 3 V, and 3.5 V, to achieve the largest hot electron production. This can be used to fulfill the second condition for producing hot electrons, that the NMOS must be in saturation condition, i.e., $V_{DS} \geq V_{GS}-V_{Tnmos}$.

Figure 11:
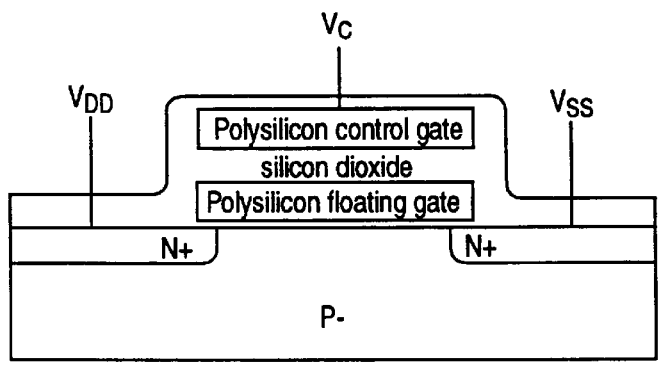
FIG. 11 is a diagrammatic view in section illustrating a conventional EPROM with a polysilicon control gate and a polysilicon floating gate.
Figure 12:
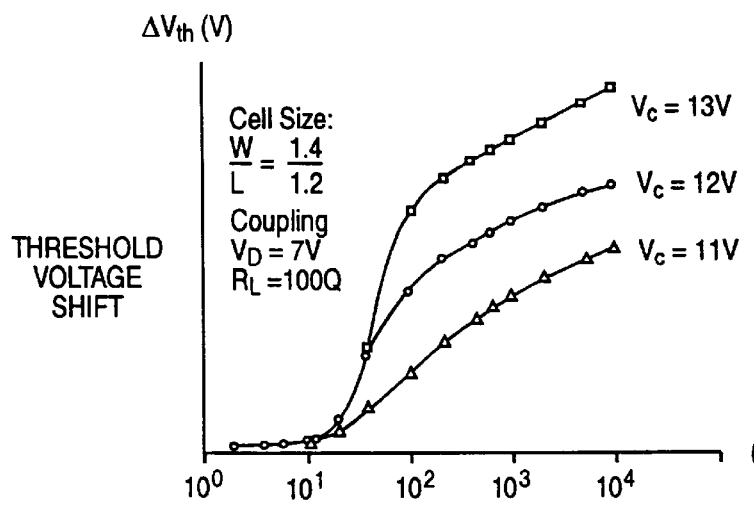
FIG. 12 is a plot illustrating the shifting of the threshold voltage in the EPROM of FIG. 11 when the floating gate is being added during fabrication, and hot electron injection is stored therein for programming purposes, varying the voltage on the control gate.
Figure 13:
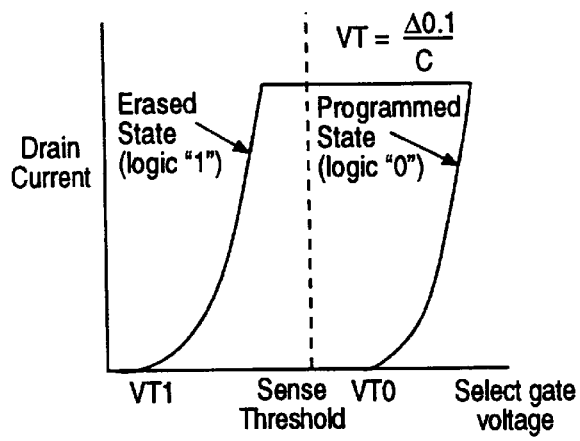
FIG. 13 shows the threshold characteristics of the EPROM of FIG. 11 in a programmed and erased state.

The non-volatile SRAM of the present invention may be substituted in many applications for a conventional Electrically-Programmable-Read-Only-Memory (EPROM) such as shown in FIG. 11. The EPROM, in addition to a polysilicon control gate, has a polysilicon floating gate of a different material then dielectric oxide. When the floating gate is being added during fabrication, hot electron injection is stored therein for programming purposes and the threshold voltage may be shifted by varying the voltage on the control gate as shown in FIG. 12. FIG. 13 shows the threshold characteristics of the EPROM in a programmed and unprogrammed state. The conventional EPROM needs a floating gate since it is not a feedback system in the manner of the present symmetrical system which, as long as there is a small difference in threshold voltages, keeps feeding back and keeps amplified. Although the impressed voltage on the SRAM cell may be 10 V or greater, the output voltages will settle at 5 V and 0 V indicating which one is originally larger. In a conventional SRAM cell the difference is usually so small that the difference cannot be determined. The result is unpredictable when the difference between the outputs, Q and Q~, in the unbalanced cell becomes smaller, then the resolution time required becomes larger so that at high frequency, if the resolution time, or access time, is not sufficient, an error in the results can be generated. In any event, the non-volatile SRAM of the invention may be produced with considerably less trouble and expense than the conventional EPROM and yet can perform program functions for the most part just as well as an EPROM.

Figure 14:
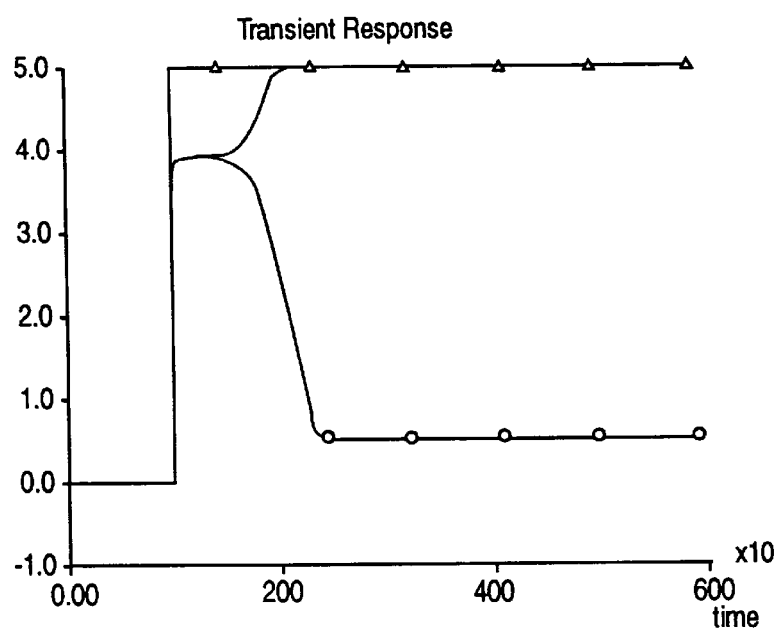
FIGS. 14–16 illustrate the transient responses of two symmetrical cells and an unsymmetrical cell, respectively, for different noted NMOS mobility values Un in a simulation of an SRAM cell in accordance with the invention.
Figure 15:
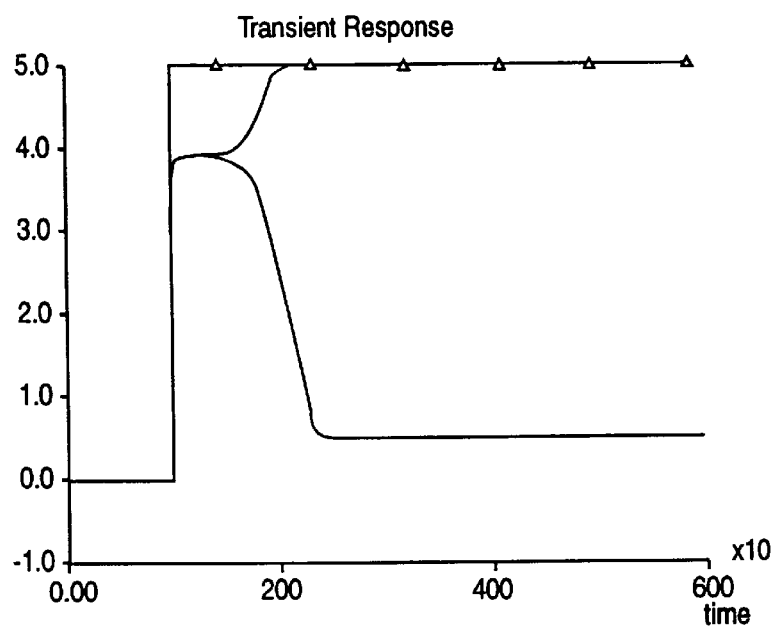
Figure 16:
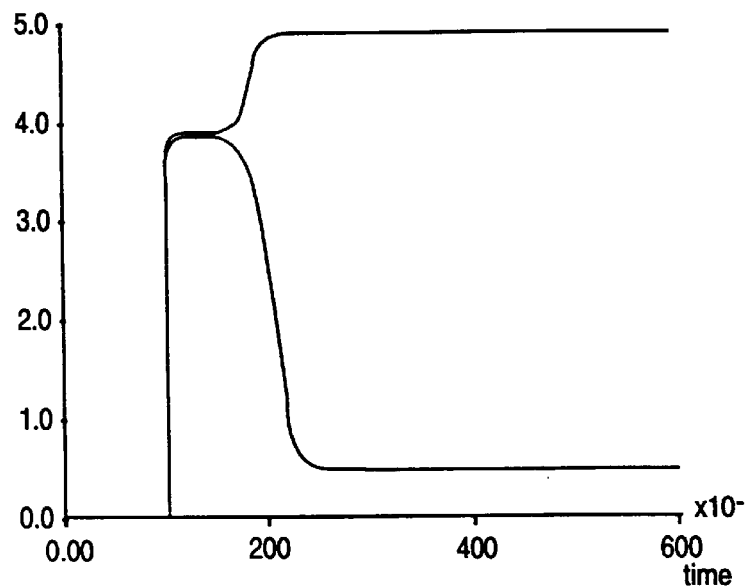
Figure 17:
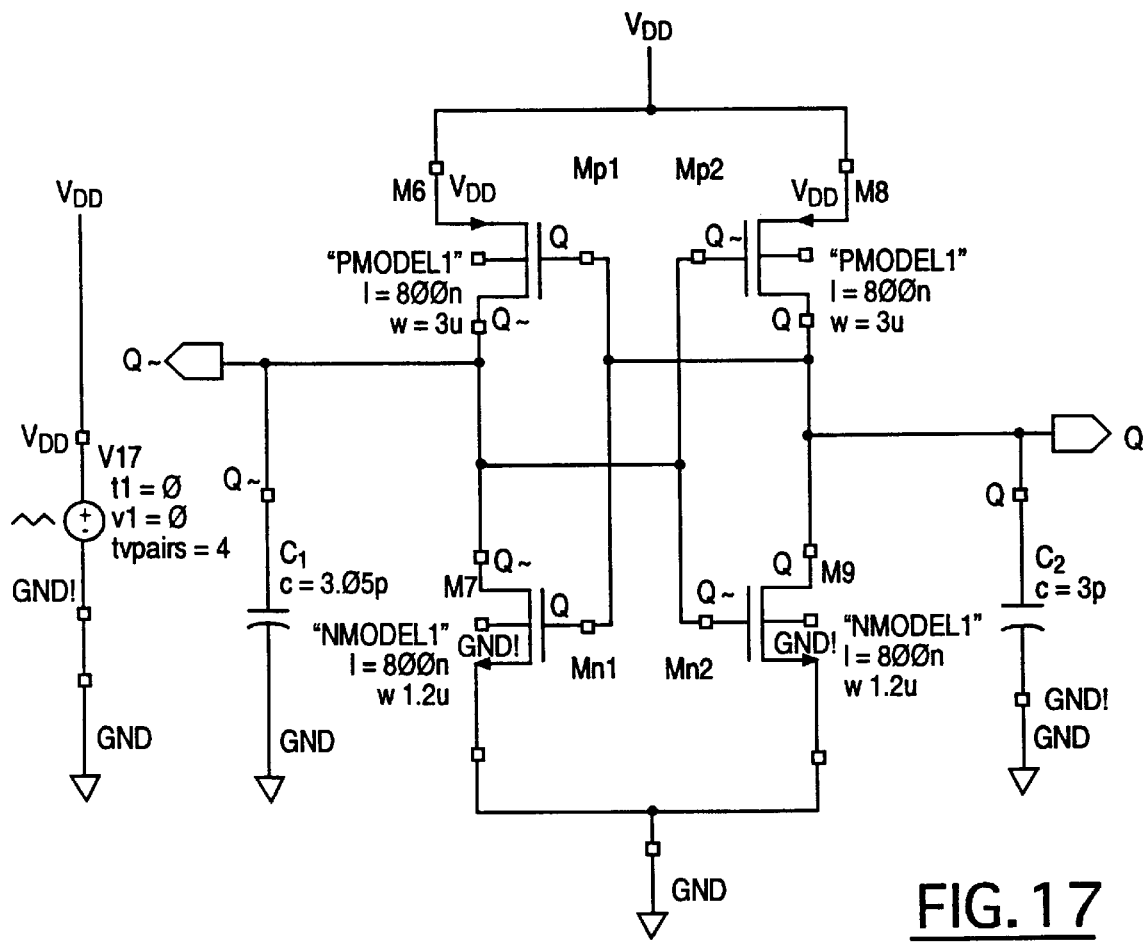
FIG. 17 is a schematic diagram illustrating an unsymmetric SRAM cell exhibiting the transient responses shown in FIG. 16.

In modeling and simulating a cell of the invention the NMOS mobility is used mainly because mobility is related to the threshold voltage which is somewhat difficult to simulate. The larger the threshold voltage, the smaller the NMOS mobility. The transient responses of two symmetrical cells and an unsymmetrical cell are shown respectively in FIGS. 14–16 for different noted mobilities Un. In FIG. 14 the mobilities are Un=479.52 (cm$^2$/V-sec.) for M1 and Un=480 (cm$^2$/V-sec.) for Mn2. In FIG. 15 the mobilities are reversed, Un=480 (cm$^2$/V-sec.) for M1 and Un=479.52 (cm$^2$/V-sec.) for Mn2. In both Figures Vdd goes from 0 V to 5 V, and the lines indicate the values of the outputs Q and Q~. As seen in FIG. 14 the outputs eventually approach a finite state or a fixed state at different voltages meaning that the thresholds are different due to the different NMOS mobilities. In FIG. 15, where the states are reversed, the two figures are mirror images. As long as there is a small mobility change, then the cells can be told apart from one another. FIG. 16 shows the case when C1 and C2 differ, i.e., C1=3.05 p and C2=3.0 p, in the SRAM shown in FIG. 17, where the loading effect is being simulated. The values 3.0 p and 3.05 p during simulation, produce a real difference (unbalance). Under such an unbalanced condition, it is desirable to know how much the threshold voltages must differ in order to make the difference always predictable, i.e., to the state that is wanted. It would appear that the mobility difference must be greater than about 480–460, that is, 20, or 5%. The 3.0 and 3.05 p small difference between the two is sufficient.

It will therefore be appreciated from the foregoing description that if the hot electron effect can be generated in a symmetrical SRAM, then the threshold voltage can be changed in an NMOS ($V_{th}$ is increased) and non-volatility can be achieved, since when $V_{th1}$ $V_{th2}$ for the two NMOSs in the SRAM cell, then the hard memory function can be established and the SRAM made non-volatile.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined in the following claims:

1. A method for rendering an SRAM non-volatile comprising the steps of:
   providing an SRAM cell comprising two back-to-back, cross-coupled, CMOS inverters, each with a PMOS and an NMOS having threshold voltages and respective outputs Q and Q~ connected therebetween; and
   rendering the threshold voltages of the NMOSs different.

2. The method according to claim 1, wherein said rendering step comprises using hot electron injection into the gate oxide of one of said NMOSs.

3. The method according to claim 2, wherein said hot electron injection is produced by establishing the conditions that 1) one of said NMOSs is in saturation condition, i.e., $V_{DS} \geq V_{GS} - V_{th}$, where $V_{DS}$ is the drain to source voltage, $V_{GS}$ is the gate to source voltage, and $V_{th}$ the threshold voltage, of said one NMOS, and 2) $V_{DS}$ is appropriate in order to create a maximum hot carrier effect in a given fabrication process.

4. The method according to claim 3, wherein said saturation condition is established by the steps comprising:
   performing a regular write function on the SRAM so that the cell will have a definite state of either a high output or a low output; and
   applying a negative voltage pulse to the source of the NMOS of the inverter on log at a time with the high output value to put its NMOS in a saturation state.

5. The method according to claim 4, wherein said negative voltage pulse is of a magnitude such that the $V_{DS}$ is sufficiently large for the fabrication process to cause hot electron injection into the gate oxide of said NMOS in a saturation state.

6. A non-volatile SRAM comprising:
   two back-to-back, cross-coupled, CMOS inverters, each with a PMOS and an NMOS having threshold voltages and respective outputs Q and Q~ connected therebetween; and
   means for rendering the threshold voltages of the NMOSs different.

7. An SRAM according to claim 6, wherein said rendering means comprises means for injecting hot electrons into the gate oxide of one of said NMOSs.

8. An SRAM according to claim 7, wherein said means for injecting hot electrons comprises:
   means for putting said one of said NMOSs in saturation condition by establishing $V_{DS}$, the drain to source voltage, $V_{GS}$ the gate to source voltage, and $V_{th}$ the threshold voltage, such that $V_{DS} \geq V_{GS} - V_{th}$; and
   means for making $V_{DS}$ sufficiently large for the fabrication process.

9. An SRAM according to claim 8, wherein said means for putting said one of said NMOSs in saturation condition comprises:
   means for performing a regular write function on the SRAM so that the cell will have a high output and a low output; and
   means for applying a negative voltage pulse to the source of the NMOS of the inverter on log at a time with the high output value to put its NMOS in a saturation state.

10. An SRAM according to claim 9, wherein said means for applying said negative voltage pulse comprises:
    a voltage source having a magnitude such that the $V_{DS}$ is sufficiently large for the fabrication process to cause hot electron injection into the gate oxide of said NMOS in a saturation state.

* * * * *